(12) United States Patent
Tsai

(10) Patent No.: US 10,641,557 B2
(45) Date of Patent: May 5, 2020

(54) COMBINED HEAT SINK

(71) Applicant: Cooler Master Co., Ltd., New Taipei (TW)

(72) Inventor: Chang-han Tsai, New Taipei (TW)

(73) Assignee: Cooler Master Co., Ltd., New Taipei (TW)

( * ) Notice: Subject to any disclaimer, the term of this patent is extended or adjusted under 35 U.S.C. 154(b) by 103 days.

(21) Appl. No.: 16/147,970

(22) Filed: Oct. 1, 2018

(65) Prior Publication Data
US 2019/0204025 A1 Jul. 4, 2019

(30) Foreign Application Priority Data
Dec. 29, 2017 (CN) .......................... 2017 1 1471964

(51) Int. Cl.
*F28D 7/02* (2006.01)
*F28F 3/06* (2006.01)
*F28F 3/08* (2006.01)
*H01L 23/367* (2006.01)
*F28D 21/00* (2006.01)

(52) U.S. Cl.
CPC ............... *F28F 3/06* (2013.01); *F28F 3/08* (2013.01); *H01L 23/3672* (2013.01); *F28D 2021/0029* (2013.01); *F28F 2215/00* (2013.01); *F28F 2275/08* (2013.01); *F28F 2280/02* (2013.01)

(58) Field of Classification Search
CPC .. F28F 3/02; F28F 3/08; F28F 2215/00; F28F 2275/08; F28F 2280/02; H01L 23/3672; F28D 2021/0029
USPC ....................................................... 165/80.3
See application file for complete search history.

(56) References Cited

U.S. PATENT DOCUMENTS

| | | | | |
|---|---|---|---|---|
| 5,201,866 A | * | 4/1993 | Mok | F28F 3/02 165/185 |
| 8,214,761 B2 | * | 7/2012 | Sasaki | H04N 1/00416 715/811 |
| 2009/0059594 A1 | * | 3/2009 | Lin | F21S 45/47 362/294 |
| 2014/0014308 A1 | * | 1/2014 | Wu | F28F 3/02 165/185 |
| 2017/0343302 A1 | * | 11/2017 | Ishikawa | F28F 3/06 |

FOREIGN PATENT DOCUMENTS

TW   M376877 U   3/2010

* cited by examiner

*Primary Examiner* — Davis D Hwu
(74) *Attorney, Agent, or Firm* — Alan D. Kamrath; Mayer & Williams PC

(57) ABSTRACT

A combined heat sink has multiple dissipation fins serially mounted together. Each one of the dissipation fins has a body and two flanges. The body has at least one through hole formed through the body. The two flanges are respectively formed on one of two surfaces of the body, and have at least one connecting arm. Multiple protrusions protrude on the at least one connecting arm, and a width of the at least one through hole is smaller than a total width of the at least one connecting arm and the multiple protrusions. When the multiple dissipation fins are mounted together, the protrusions of the at least one connecting arm of each dissipation fin pass through the at least one through hole of an adjacent one of the dissipation fins, and abut an area near the at least one through hole to avoid separations of the dissipation fins.

10 Claims, 4 Drawing Sheets

COMBINED HEAT SINK

BACKGROUND OF THE INVENTION

1. Field of the Invention

The present invention relates to a heat sink, and more particularly to a combined heat sink that comprises multiple dissipation fins combined together.

2. Description of Related Art

Heat dissipation has become more and more crucial as electronic equipments have been highly developed with complex functions. A conventional heat sink is formed by multiple dissipation fins combined together, and methods for combination greatly influence manufacture efficiency of the conventional heat sink.

Taiwan Patent No. M376877 discloses a conventional combined heat sink comprising multiple dissipation fins. Each one of the dissipation fins has two L-shaped connection arms. A user has to bend the two connection arms of one of the dissipation fins to respectively pass through two holes on another one of the dissipation fins, so as to combine the two dissipation fins together. However, such a combination method leads to complicated assembly procedure of the conventional combined heat sink, which makes it difficult for the user to firmly assemble the multiple dissipation fins.

To overcome the shortcomings, the present invention provides a combined heat sink to mitigate or obviate the aforementioned problems.

SUMMARY OF THE INVENTION

The main objective of the present invention is to provide a combined heat sink that may be assembled firmly in an easy way.

A combined heat sink in accordance with the present invention has multiple dissipation fins serially mounted together, and each one of the multiple dissipation fins has a body and two flanges. The body has two surfaces and at least one through hole formed through the body. The two flanges are respectively formed on one of the two surfaces of the body, and have at least one connecting arm connected to one of the two flanges. Multiple protrusions protrude on the at least one connecting arm separately, and a width of the at least one through hole is smaller than a total width of the at least one connecting arm and the multiple protrusions.

When the multiple dissipation fins are mounted together, the multiple protrusions of the at least one connecting arm of each one of the dissipation fins pass through the at least one through hole of an adjacent one of the dissipation fins, and abut an area near the at least one through hole to avoid separations of the multiple dissipation fins.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
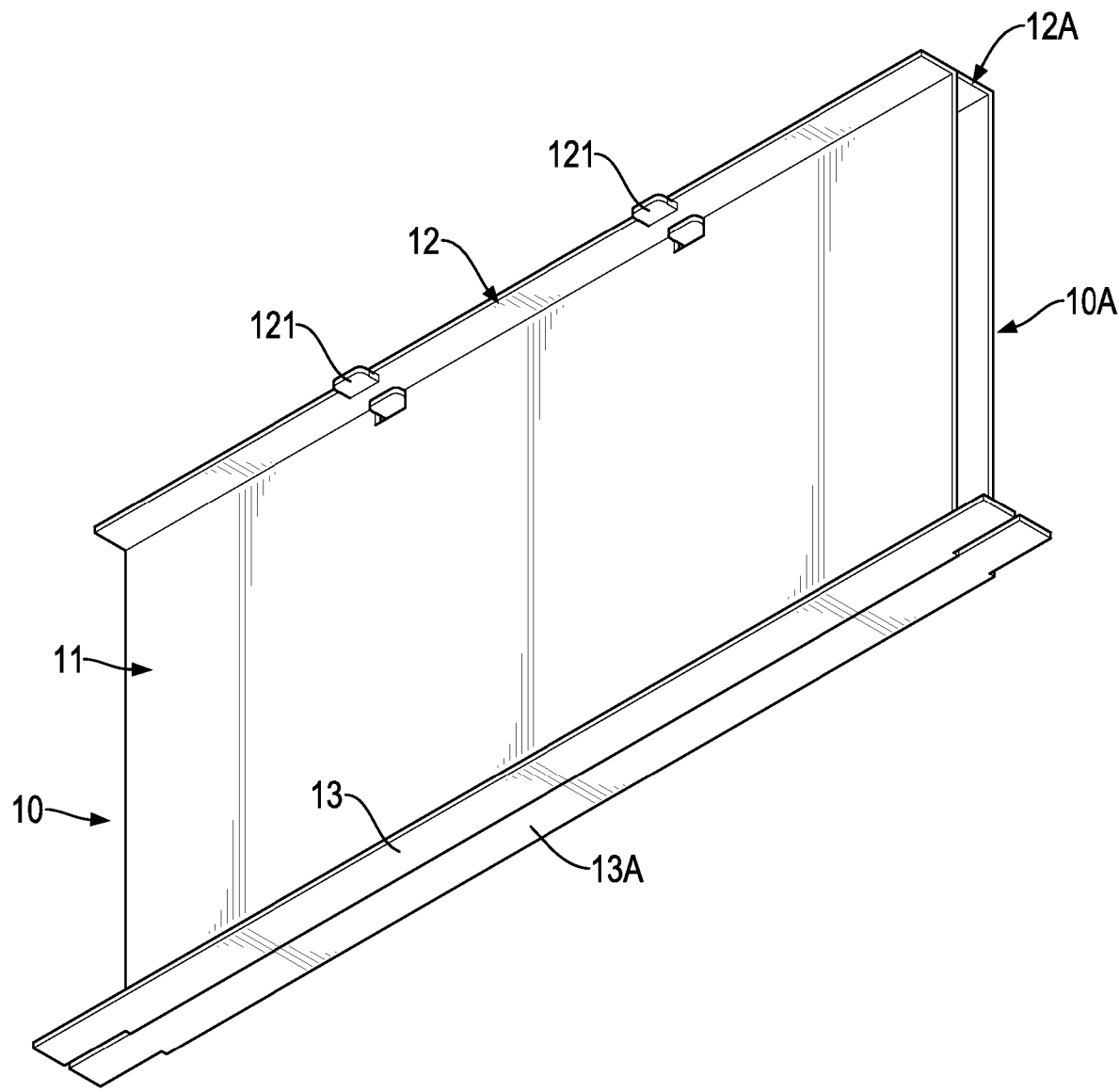
FIG. 1 is a perspective view of a first embodiment of a combined heat sink in accordance with the present invention.
Figure 2:
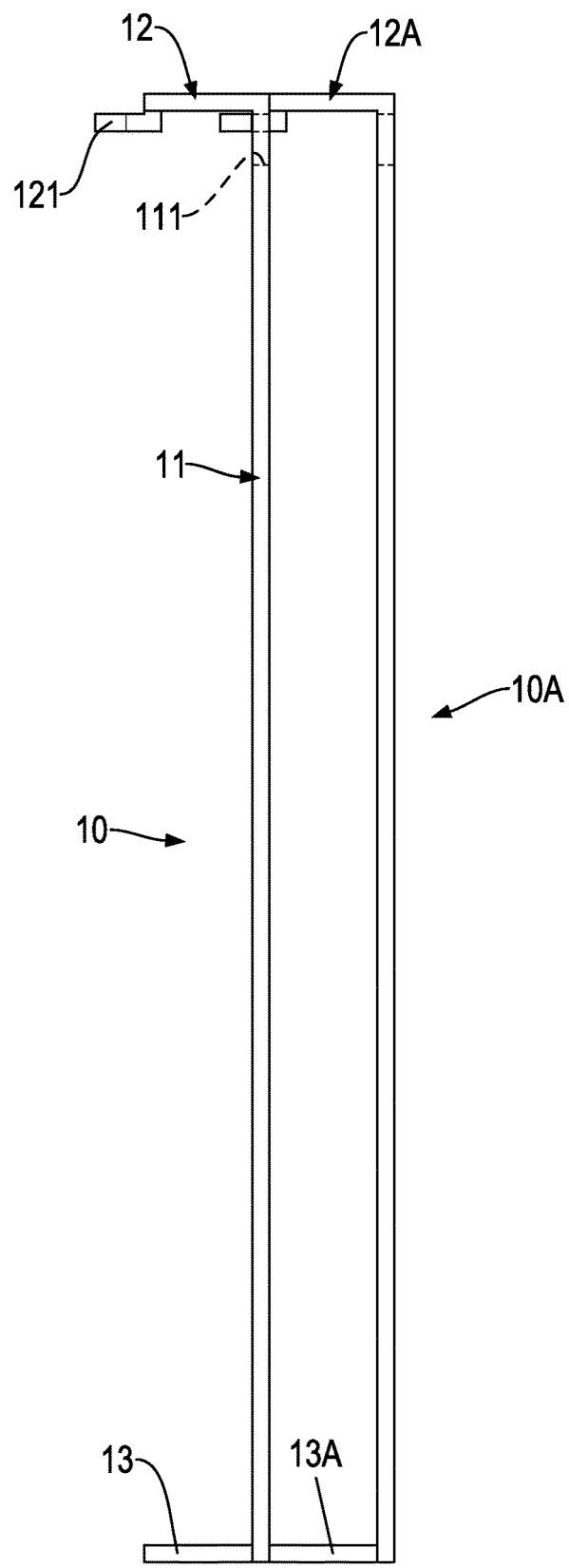
FIG. 2 is a side view of the combined heat sink in FIG. 1.

With reference to FIGS. 1 and 2, a combined heat sink comprises multiple dissipation fins 10 aligned and serially mounted together. For the sake of convenience, only two dissipation fins 10, 10A are shown in the drawings, but the amount of the dissipation fins 10 is not limited in the present invention.

Figure 3:
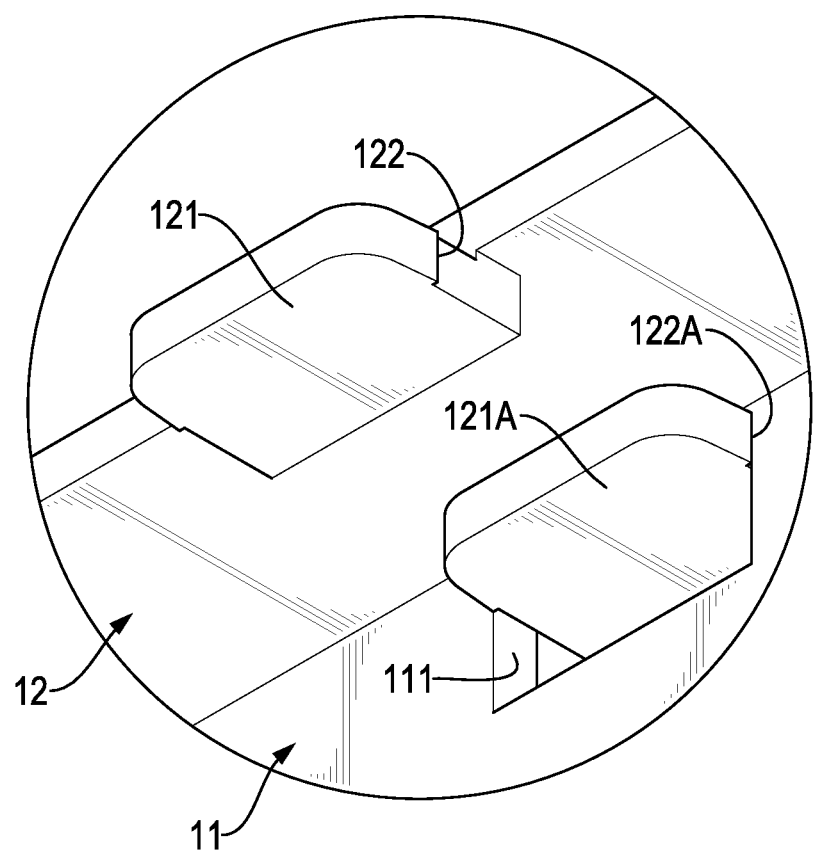
FIG. 3 is an enlarged perspective view in partial section of the combined heat sink in FIG. 1.

With reference to FIGS. 1 to 3, each one of the multiple dissipation fins 10 has a body 11 and two flanges. The body 11 and the two flanges are formed as one piece. The body 11 is a metal slice having a good heat-dissipating ability. The body 11 has two surfaces and at least one through hole 111. In the first embodiment of the present invention, the body 11 has two through holes 111. The two through holes 111 are formed through the two surfaces of the body 11, respectively, and are aligned with each other near a top side of the body 11.

The two flanges of the dissipation fin 10 connected to the body 11 are formed by a punching process, and respectively are a connecting flange 12 and an abutting flange 13. The connecting flange 12 is formed on a surface of the body 11 from the top side of the body 11, near the two through holes 111. The connecting flange 12 has at least one connecting arm 121. The at least one connecting arm 121 is connected to the connecting flange 12 at a location corresponding to the at least one through hole 111 of the body 11.

In the first embodiment of the present invention, the connecting flange 12 has two connecting arms 121. The two connecting arms 121 are disposed at a spaced interval on a bottom surface of the connecting flange 12. The two connecting arms 121 protrude from an edge, which is located away from the body 11, of the connecting flange 12. As shown in FIG. 2, each one of the two connecting arms 121 transversely aligns with a respective one of the two through holes 111, and has two protrusions 122 on two sides of the connecting arms 121, respectively. In addition, a width of each one of the two through holes 111 is slightly smaller than a total width of each one of the two connecting arms 121 and the two protrusions 122 of the corresponding connecting arm 121, so that each one of the two connecting arms 121 may be forced to pass through the corresponding through hole 111.

Besides, the connecting arms 121 and the protrusions 122 are made of a material with plasticity.

In the first embodiment of the present invention, each one of the protrusions 122 is a barb. Alternatively, each of the protrusions 122 may be a mounting boss.

The abutting flange 13 is formed on the same surface of the body 11 with the connecting flange 12, and is located on a bottom side of the body 11, which is located away from the connecting flange 12. Moreover, a length of the abutting flange 13 is equal to a length of the connecting flange 12, wherein a length of the two connecting arms 121, which are located underneath, is not included. Therefore, an edge of the abutting flange 13 and the edge of the connecting flange 12 are aligned in a direction parallel to the surfaces of the body 11.

With reference to FIGS. 2 and 3, when two of the multiple dissipation fins 10, 10A are mounted together, the two connecting arms 121A of one of the dissipation fins 10, 10A are forced to pass through the two through holes 111 of the other one of the two dissipation fins 10. The two protrusions 122A of each connecting arm 121A then abut against an area near the corresponding through hole 111 on the surface of the body 11 of the other dissipation fin 10. The edges of the connecting flange 12A and the abutting flange 13A of the dissipation fin 10A abut on the surface of the body 11, which is located away from the connecting flange 12 and the abutting flange 13, of the other dissipation fin 10. As a result, the two dissipation fins 10, 10A are fixed together.

Figure 4:
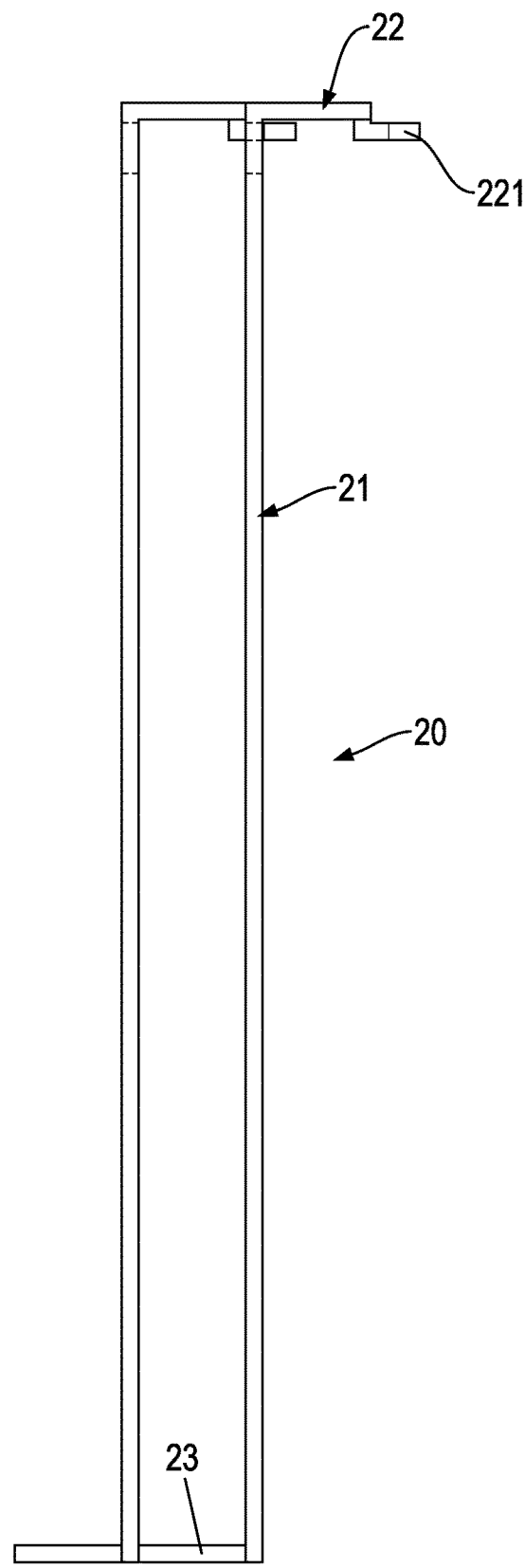
FIG. 4 is a side view of a second embodiment of a combined heat sink in accordance with the present invention.

With reference to FIG. 4, in a second embodiment of the present invention, a combined heat sink in accordance with the present invention differs from the first embodiment in that the connecting flange 22 and the abutting flange 23 are respectively formed on the two different surfaces of the body 21 of one of the multiple dissipation fins 20. That is to say, when the multiple dissipation fins 20 are mounted together through the connecting arms 221, the connecting flange 22 and the abutting flange 23 of one of the multiple dissipation fins 20 abut against different dissipation fins 20.

With the aforementioned technical characteristics, the combined heat sink in accordance with the present invention has the following advantages.

1. To assemble one dissipation fin 10, 20 with the others, a user may press the multiple dissipation fins 10, 20 together, in order to force the at least one connecting arm 121, 221 to pass through a corresponding through hole 111 of the other dissipation fin 10, 20. Then the dissipation fins 10, 20 may be fixed firmly together to become the combined heat sink.

2. Furthermore, the assembly of the dissipation fins 10, 20 is thus simplified through structural arrangements in the combined heat sink in accordance with the present invention.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A combined heat sink comprising multiple dissipation fins serially mounted together, and each one of the multiple dissipation fins having:
   a body having
      two surfaces; and
      at least one through hole formed through the body; and
   two flanges respectively formed on one of the two surfaces of the body and having
      at least one connecting arm connected to one of the two flanges of the dissipation fin and having
         multiple protrusions protruding on the at least one connecting arm separately, and a width of the at least one through hole being smaller than a total width of the at least one connecting arm and the multiple protrusions;
   wherein when the multiple dissipation fins are mounted together, the multiple protrusions of the at least one connecting arm of each one of the dissipation fins pass through the at least one through hole of an adjacent one of the dissipation fins, and abut an area near the at least one through hole to avoid separations of the multiple dissipation fins.

2. The combined heat sink as claimed in claim 1, wherein the body and the two flanges are formed as one piece.

3. The combined heat sink as claimed in claim 1, wherein the two flanges of each dissipation fin are formed by a punching process.

4. The combined heat sink as claimed in claim 2, wherein the two flanges of each dissipation fin are formed by a punching process.

5. The combined heat sink as claimed in claim 4, wherein the two flanges of each dissipation fin are formed on different sides of the same surface of the body.

6. The combined heat sink as claimed in claim 4, wherein each one of the two flanges of each dissipation fin is formed on a respective one of the two surfaces of the body.

7. The combined heat sink as claimed in claim 5, wherein each one of the multiple protrusions is a barb or a mounting boss.

8. The combined heat sink as claimed in claim 6, wherein each one of the multiple protrusions is a barb or a mounting boss.

9. The combined heat sink as claimed in claim 7, wherein the at least one connecting arm and the multiple protrusions are made of a material with plasticity.

10. The combined heat sink as claimed in claim 8, wherein the at least one connecting arm and the multiple protrusions are made of a material with plasticity.

* * * * *